United States Patent
Sawano et al.

(10) Patent No.: US 8,158,328 B2
(45) Date of Patent: Apr. 17, 2012

(54) COMPOSITION FOR FORMATION OF ANTI-REFLECTION FILM, AND METHOD FOR FORMATION OF RESIST PATTERN USING THE SAME

(75) Inventors: Atsushi Sawano, Kanagawa (JP); Jun Koshiyama, Kanagawa (JP); Takako Hirosaki, Kanagawa (JP)

(73) Assignee: Tokyo Ohka Kogyo Co., Ltd., Kanagawa (JP)

( * ) Notice: Subject to any disclaimer, the term of this patent is extended or adjusted under 35 U.S.C. 154(b) by 326 days.

(21) Appl. No.: 12/449,494

(22) PCT Filed: Jan. 8, 2008

(86) PCT No.: PCT/JP2008/050076
§ 371 (c)(1),
(2), (4) Date: Aug. 11, 2009

(87) PCT Pub. No.: WO2008/099620
PCT Pub. Date: Aug. 21, 2008

(65) Prior Publication Data
US 2010/0104978 A1 Apr. 29, 2010

(30) Foreign Application Priority Data

Feb. 15, 2007 (JP) ................................. 2007-035300
Feb. 15, 2007 (JP) ................................. 2007-035301

(51) Int. Cl.
G03F 7/11 (2006.01)
G03F 7/26 (2006.01)

(52) U.S. Cl. .................... 430/270.1; 430/273.1; 430/322

(58) Field of Classification Search ............... 430/270.1, 430/271.1, 273.1, 322, 327, 330
See application file for complete search history.

(56) References Cited

U.S. PATENT DOCUMENTS

| 4,910,122 | A | | 3/1990 | Arnold et al. ................. 430/313 |
| 5,783,362 | A | * | 7/1998 | Wakiya et al. ............. 430/273.1 |
| 6,555,510 | B2 | * | 4/2003 | Lamanna et al. ............. 510/175 |
| 6,555,607 | B1 | * | 4/2003 | Kanda et al. .................. 524/366 |
| 6,818,384 | B2 | * | 11/2004 | Choi et al. ..................... 430/311 |
| 2007/0160930 | A1 | * | 7/2007 | Wang et al. ................ 430/270.1 |
| 2008/0032202 | A1 | * | 2/2008 | Ishizuka et al. ................... 430/4 |

FOREIGN PATENT DOCUMENTS

| JP | 62-226148 | 10/1987 |
| JP | 3-222409 | 10/1991 |
| JP | 4-55323 | 9/1992 |
| JP | 2000-187331 | 7/2000 |
| JP | 2005-157259 | 6/2005 |
| JP | 2006-336017 | 12/2006 |
| KR | 10-2001-0089175 | 9/2001 |
| WO | 01/00735 | 1/2001 |
| WO | WO 2005/103098 | * 11/2005 |
| WO | 2007/007780 | 1/2007 |

OTHER PUBLICATIONS

Machine translation of JP 2005-157259, published on Jun. 16, 2005.*
International Search Report issued Feb. 5, 2008 in the International (PCT) Application of which the present application is the U.S. National Stage. PCT/JP2008/050076.
Korean Office Action issued Dec. 26, 2011 in corresponding Korean Application No. 10-2009-7015765.
Japanese Office Action issued Jan. 10, 2012 in corresponding Japanese Application No. 2007-035300.

* cited by examiner

Primary Examiner — Anca Eoff
(74) Attorney, Agent, or Firm — Wenderoth, Lind & Ponack, L.L.P.

(57) ABSTRACT

A composition for forming an anti-reflection film on a resist film is provided, which is superior in handling characteristics, and is not accompanied by generation of deposits and the like after forming the film. A composition for forming an anti-reflection film to be provided on a resist film is provided, which includes at least a certain fluorochemical surfactant, and a certain water soluble film forming component. The composition for forming an anti-reflection film can be easily handled, has no adverse effect on health or the environment, and also avoids the generation of deposits and the like even after forming an anti-reflection film.

13 Claims, No Drawings

COMPOSITION FOR FORMATION OF ANTI-REFLECTION FILM, AND METHOD FOR FORMATION OF RESIST PATTERN USING THE SAME

This application is a U.S. national stage of International Application No. PCT/JP2008/050076 filed Jan. 8, 2008.

TECHNICAL FIELD

The present invention relates to a composition for forming an anti-reflection film to be provided on a resist film, and a method for forming a resist pattern using the composition for forming an anti-reflection film.

BACKGROUND ART

Semiconductor substrates are, as is generally known, formed by laminating at least a dielectric layer (insulation layer) on a silicon wafer or the like. A patterned conductive layer (i.e., a wiring layer) is then formed in the dielectric layer of the semiconductor substrate to form a semiconductor wiring structure.

The formation of the wiring layer is carried out as follows. First, a conductive layer is formed on a dielectric layer uniformly, and a resist film is formed on this conductive layer. A resist pattern is formed by irradiating (exposing) this resist film with a patterning light, followed by development, and a wiring layer is formed by patterning of the conductive layer with an etching process using the resist pattern as a mask. Then, after removing the resist film completely, a dielectric layer is further laminated on the conductive layer to configure a wiring layer in the dielectric layer.

It has been conventionally known that a problem referred to as a stationary wave effect due to multiple interference occurs when a pattern is formed by irradiating a resist film with light in the step of forming a wiring layer. That is, irradiated light is transmitted through the resist film, and the transmitted light is reflected on an underlayer surface and a part of the reflected light is further reflected on an upper surface of the resist film, with such event being repeated in the resist film. As a result of interference between light irradiated at a single wavelength, which has entered the resist film formed on the substrate, and light reflected from the substrate, variation in the amount of light energy absorbed in a thickness direction of the resist film occurs. This variation affects a size width of the resist pattern obtained after development, resulting in a reduction of the dimensional accuracy of the resist pattern.

This reduction in the dimensional accuracy of the resist pattern is of significant concern, particularly when a fine pattern is formed on a substrate having varying levels because the thickness of the resist film becomes inevitably different at the relief structures in portions having such varying levels. Thus, it has been desired to develop a technology in which the above interference effect is eliminated and the dimensional accuracy of the resist pattern is not reduced even in the case of fine patterns formed on a substrate having varying levels.

Consequently, a method in which an anti-reflection film having a property of absorbing the exposed light is formed before forming a resist film on a substrate and a resist film is formed on the anti-reflection film (for example, Patent Document 1, etc.); and a method in which an anti-reflection film constituted with polysiloxane, polyvinyl alcohol or the like is formed on a resist film provided on a substrate (for example, Patent Documents 2 and 3, etc.) have been employed conventionally.

Patent Document 1: U.S. Pat. No. 4,910,122.

Patent Document 2: Japanese Examined Patent Application Publication No. H04-55323.

Patent Document 3: Japanese Unexamined Patent Application Publication No. H03-222409.

Patent Document 4: Japanese Unexamined Patent Application Publication No. 2005-157259

DISCLOSURE OF THE INVENTION

Problems to be Solved by the Invention

However, in the method in which an anti-reflection film is formed on a substrate, mask alignment carried out using a light having the same wavelength as that of the exposure light may be disadvantageous since the detection signal of the mask alignment is attenuated by the anti-reflection film, thereby leading to difficulties in aligning the mask. In addition, it is necessary to transfer the resist pattern to the anti-reflection film with favorable accuracy, and the anti-reflection film must be removed by etching or the like without affecting the substrate following the transfer. Thus, the number of operation steps increases accordingly; therefore, the method cannot always be applied to any substrate processing.

On the other hand, the method of forming an anti-reflection film on a resist film provided on a substrate is suitable for practical use, without need of complicated steps.

However, in such a method in which an anti-reflection film is formed on a resist film provided on a substrate, $C_8F_{17}SO_3H$ (PFOS) is used at present as a fluorochemical surfactant in the anti-reflection film forming material. This substance is problematic in handling since it is a designated chemical substance in Japan, and also is subject to Significant New Use Rule (SNUR) that is a rule related to ecological effects in USA. Specifically, the substance relevant to SNUR can involve taking risks which may impair the health or environment, therefore, wearing of protective equipment in the workplace, and notice, education, training and the like for employees about hazardous properties are required. Furthermore, disposal is also regulated. Therefore, an anti-reflection film forming material which includes in place of $C_8F_{17}SO_3H$ (PFOS), a fluorochemical surfactant that can be easily handled without environmental problems, and exhibits similar effects to those achieved when $C_8F_{17}SO_3H$ (PFOS) is used has been demanded.

Thus, Patent Document 4 discloses a resist upper layer film forming material which is to be provided on a resist film, and includes at least a selective soluble resin component and a fluorine carbide compound that can be easily handled.

However, although the resist upper layer film forming material disclosed in Patent Document 4 does not use PFOS as a fluorochemical surfactant, there have been problems of defects such as generation of deposits when such a fluorochemical surfactant is used in combination with a water soluble film forming component generally employed. When deposits are generated on an anti-reflection film, the resist film may not be patterned properly. Therefore, resolution of such defects has been desired.

The present invention was made in view of the foregoing problems, and an object of the invention is to provide a composition for forming an anti-reflection film on a resist film, which can be easily handled, without generation of deposits and the like after forming the film.

Means for Solving the Problems

The present inventors found that deposits and the like are not generated even after forming an anti-reflection film when a certain fluorochemical surfactant and a certain water soluble film forming component are used in combination in a composition for forming an anti-reflection film. Accordingly, the present invention had been completed.

A first aspect of the present invention provides a composition for forming an anti-reflection film to be provided on a resist film, the composition including at least a fluorochemical surfactant and a water soluble film forming component, in which the fluorochemical surfactant is at least one selected from compounds represented by the following general formulae (1) to (4), and the water soluble film forming component includes a water soluble resin having at least a constituent unit represented by the following general formula (5).

(1)

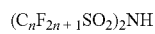
(2)

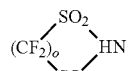
(3)

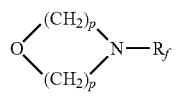
(4)

In the above general formulae (1) to (4): m represents an integer of 10 to 15; n represents an integer of 1 to 5; o represents 2 or 3; p represents 2 or 3; and $R_f$ represents a hydrogen atom or an alkyl group having 1 to 16 carbon atoms in which a portion or all hydrogen atoms are substituted with a fluorine atom. The alkyl group may have a hydroxy group, an alkoxyalkyl group, a carboxyl group, or an amino group.

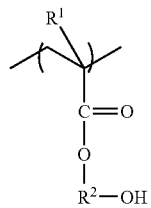
(5)

In the above general formula (5), $R^1$ represents a hydrogen atom or a methyl group, and $R^2$ represents an alkylene chain having 1 to 6 carbon atoms.

A second aspect of the present invention provides a composition for forming an anti-reflection film to be provided on a resist film, the composition including at least a fluorochemical surfactant and a water soluble film forming component, in which the fluorochemical surfactant is at least one selected from compounds represented by the following general formulae (1) to (4), and the water soluble film forming component includes at least a water soluble resin represented by the following general formula (6).

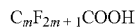
(1)

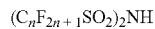
(2)

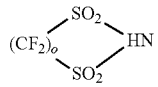
(3)

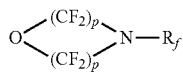
(4)

In the above general formulae (1) to (4): m represents an integer of 10 to 15; n represents an integer of 1 to 5; o represents 2 or 3; p represents 2 or 3; and $R_f$ represents a hydrogen atom or an alkyl group having 1 to 16 carbon atoms in which a portion or all hydrogen atoms are substituted with a fluorine atom. The alkyl group may have a hydroxy group, an alkoxyalkyl group, a carboxyl group, or an amino group.

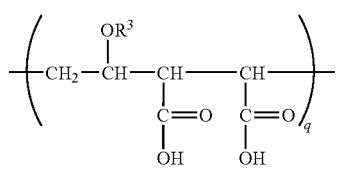
(6)

In the above general formula (6), $R^3$ represents a hydrogen atom, or an alkyl group or a hydroxyalkyl group having 1 to 6 carbon atoms, and q represents the number of repeating units.

A third aspect of the present invention provides a method for forming a resist pattern, the method including: forming a resist film on a substrate; forming an anti-reflection film on the resist film using the composition for forming an anti-reflection film of the present invention; selectively irradiating the resist film, through the anti-reflection film, with light, resulting in an irradiated resist film, and carrying out a heat treatment as needed; and removing the anti-reflection film to obtain the resist pattern before subjecting the irradiated resist film to a developing process or during the development process.

Effects of the Invention

Since the composition for forming an anti-reflection film of the present invention does not contain a compound such as PFOS, it can be easily handled, and adverse effects on health and the environment can be avoided. In addition, since deposits and the like are not generated even after forming an anti-reflection film, adverse effects on patterning of the resist film can be avoided.

PREFERRED MODE FOR CARRYING OUT THE INVENTION

Hereinafter, embodiments of the present invention will be explained in detail.

Composition for Forming Anti-Reflection Film

The composition for forming an anti-reflection film of the present invention is characterized by including at least a certain fluorochemical surfactant, and a certain water soluble film forming component. In addition, the composition for forming an anti-reflection film of the present invention may further include a nitrogen-containing compound, and may also include a nonionic surfactant or an anionic surfactant.

Fluorochemical Surfactant

The fluorochemical surfactant used in the composition for forming an anti-reflection film of the present invention is at least one selected from the compounds represented by the following general formulae (1) to (4).

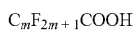  (1)

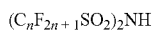  (2)

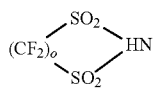  (3)

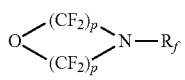  (4)

In the above general formulae (1) to (4): m represents an integer of 10 to 15; n represents an integer of 1 to 5; o represents 2 or 3; p represents 2 or 3; and $R_f$ represents a hydrogen atom or an alkyl group having 1 to 16 carbon atoms in which a portion or all hydrogen atoms are substituted with a fluorine atom. The alkyl group may have a hydroxy group, an alkoxyalkyl group, a carboxyl group, or an amino group.

Specifically, as the fluorochemical surfactant represented by the general formula (1), the compound represented by the following formula (1a) is preferred.

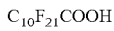  (1a)

Specifically, as the fluorochemical surfactant represented by the general formula (2), the compound represented by the following formula (2a) or (2b) is preferred.

  (2a)

  (2b)

Specifically, as the fluorochemical surfactant represented by the general formula (3), the compound represented by the following formula (3a) is preferred.

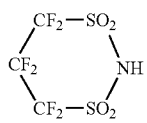  (3a)

Specifically, as the fluorochemical surfactant represented by the general formula (4), the compound represented by the following formula (4a) is preferred.

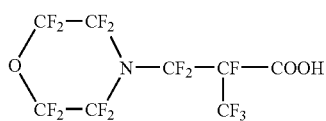  (4a)

When such a fluorochemical surfactant is used, the refractive index of the anti-reflection film is almost equal to that of the anti-reflection film formed using $C_8F_{17}SO_3H$ (PFOS), and favorable film forming performance of the anti-reflection film can be achieved.

The content of the fluorochemical surfactant used in the composition for forming an anti-reflection film is preferably no less than 0.1% by mass and no greater than 15.0% by mass, and more preferably no less than 1.0% by mass and no greater than 3.0% by mass. When the fluorochemical surfactant is included at a content falling within the above range, an anti-reflection film having favorable antireflection characteristics and film coating performance can be obtained.

Water Soluble Film Forming Component

The water soluble film forming component used in the composition for forming an anti-reflection film of the present invention includes a water soluble resin having at least a constituent unit represented by the following general formula (5), or a water soluble resin represented by the following general formula (6).

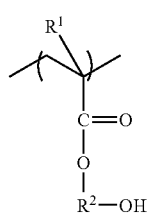  (5)

In the above general formula (5), $R^1$ represents a hydrogen atom or a methyl group, and $R^2$ represents an alkylene chain having 1 to 6 carbon atoms.

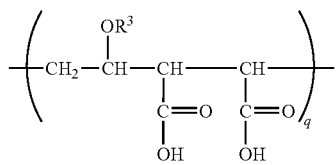  (6)

In the above general formula (6), $R^3$ represents a hydrogen atom, or an alkyl group or a hydroxyalkyl group having 1 to 6 carbon atoms, and q represents the number of repeating units.

Where $R^1$ is preferably a hydrogen atom, and $R^2$ is preferably an alkylene chain having 1 to 3 carbon atoms. Further, specific examples of preferable $R^3$ include a methyl group, an ethyl group, and a hydroxyethyl group.

By using a water soluble resin having at least a constituent unit represented by the general formula (5), or a water soluble resin represented by the general formula (6) as the water soluble film forming component, deposits and the like are not generated after forming an anti-reflection film, even in the case in which the fluorochemical surfactant is used in combination. Accordingly, favorable resist patterns can be obtained without adversely influencing patterning of a resist film.

The water soluble resin having at least a constituent unit represented by the general formula (5) may be a copolymer having a constituent unit represented by the above general formula (5), and a constituent unit derived from an acrylic acid and/or methacrylic acid. By using such a copolymer, heat resistance can be improved.

The water soluble resin has a mass average molecular weight of preferably 1,000 to 1,000,000, and more preferably 10,000 to 500,000. By adjusting the mass average molecular weight of the water soluble resin to fall within the above range, stability of the coated film can be improved.

The composition for forming an anti-reflection film of the present invention may further include a water soluble resin, which is generally used in compositions for forming an anti-reflection film, as a water soluble film forming component. Specific examples include cellulosic polymers such as hydroxypropylmethylcellulose phthalate, hydroxypropylmethylcellulose acetatephthalate, hydroxypropylmethylcellulose acetatesuccinate, hydroxypropylmethylcellulose hexahydrophthalate, hydroxypropylmethylcellulose, hydroxypropylcellulose, hydroxyethylcellulose, cellulose acetate hexahydrophthalate, carboxymethylcellulose, ethylcellulose and methylcellulose; acrylic acid-based polymers prepared using a monomer such as polyacrylamide, N,N-dimethylacrylamide, N,N-dimethylaminopropylmethacrylamide, N,N-dimethylaminopropylacrylamide, N-methylacrylamide, diacetoneacrylamide, N,N-dimethylaminoethyl methacrylate, N,N-diethylaminoethyl methacrylate, N,N-dimethylaminoethyl acrylate, acryloylmorpholine or acrylic acid; vinyl polymers such as polyvinylalcohol and polyvinylpyrrolidone; copolymers of vinylpyrrolidone/acrylic acid; copolymers of acrylamide/diacetoneacrylamide; and the like. Among these, acrylic acid-based polymers, polyvinylpyrrolidone and the like are preferable.

When the water soluble resin having at least a constituent unit represented by the general formula (5) and an other water soluble resin are used as water soluble film forming components, the content of the other water soluble resin may be preferably no greater than 10% by mass, and more preferably no greater than 3% by mass based on the entire water soluble film forming components.

Moreover, when the water soluble resin represented by the general formula (6) and an other water soluble resin are used as water soluble film forming components, the content of the other water soluble resin may be preferably no greater than 20% by mass, and more preferably no greater than 10% by mass based on the entire water soluble film forming components.

The concentration of the water soluble film forming component as a whole used in the composition for forming an anti-reflection film is preferably no less than 0.5% by mass and no greater than 10.0% by mass, and more preferably no less than 1.0% by mass and no greater than 5.0% by mass. By adjusting the concentration of the water soluble film forming component to fall within the above range, stability of the coated film can be improved.

Nitrogen-Containing Compound

The composition for forming an anti-reflection film of the present invention may further include a nitrogen-containing compound. Examples of suitable nitrogen-containing compound include quaternary ammonium hydroxide, alkanolamine compounds, and amino acid derivatives.

Examples of the quaternary ammonium hydroxide include tetramethylammonium hydroxide, tetraethylammonium hydroxide, tetrapropylammonium hydroxide, tetrabutylammonium hydroxide, methyltripropylammonium hydroxide, methyltributylammonium hydroxide, choline, and the like.

Examples of the alkanolamine compound include 3-amino-1,2-propanediol, 2-amino-1,3-propanediol, triisopropanolamine, triethanolamine, amino-2-methyl-1,3-propanediol, and the like.

Examples of the amino acid derivative include glycine, alanine, valine, leucine, isoleucine, proline, phenylalanine, tryptophan, methionine, serine, threonine, cysteine, tyrosine, asparagine, glutamine, aspartic acid, glutamic acid, lysine, arginine, histidine, 4-hydroxyproline, desmosin, γ-aminobutyric acid, β-cyanoalanine, and the like.

The foregoing nitrogen-containing compounds may be used alone, or in combination. Also, alkanolamine compounds are preferred among these nitrogen-containing compounds, and 3-amino-1,2-propanediol and 2-amino-1,3-propanediol are more preferred.

Surfactant

The composition for forming an anti-reflection film of the present invention may further include a nonionic surfactant or an anionic surfactant for the purpose of improving coating properties.

Nonionic Surfactant

Examples of the nonionic surfactant include those represented by the general formula (7):

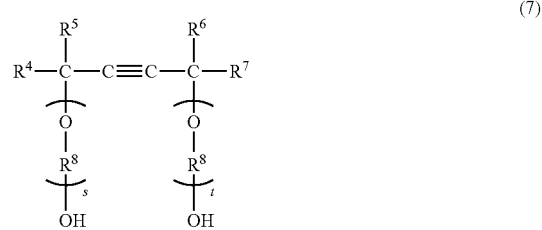

(7)

in the above general formula (7), $R^4$ to $R^7$ each independently represent a straight or branched alkyl group having 1 to 6 carbon atoms; $R^8$ represents a straight or branched alkylene chain having 2 to 4 carbon atoms; and s and t each independently represent an integer of 0 to 30.

Where $R^4$ to $R^7$ are preferably a methyl group, an ethyl group, and an isopropyl group. $R^8$ is preferably an ethylene chain, a propylene chain, and a butylene chain. Moreover, s and t are preferably an integer of 0 to 16.

Specific examples of the nonionic surfactant represented by the above general formula (7) include "Surfinol 104 series" and "Surfinol 400 series" manufactured by Air Products and Chemicals, Inc., and the like. Of these, "Surfinol 104 series" is preferred.

Anionic Surfactant

Examples of the anionic surfactant include those represented by the general formula (8):

$R^9$—SO$_3$H (8)

in the above general formula (8), $R^9$ represents a straight or branched alkyl group having 7 to 20 carbon atoms. The alkyl group may have a hydroxy group and/or a carboxyl group, and may be interrupted by a phenylene group and/or an oxygen atom.

Where $R^9$ is preferably a straight or branched alkyl group having 8 to 11 carbon atoms.

Specific examples of the anionic surfactant represented by the general formula (8) include n-octanesulfonic acid, n-nonanesulfonic acid, n-decanesulfonic acid, and n-undecanesulfonic acid. Among these, n-octanesulfonic acid, n-nonanesulfonic acid, and n-decanesulfonic acid are preferred.

Furthermore, examples of the anionic surfactant include anionic surfactants represented by the general formula (9) and the general formula (10).

$R^{10}$—CO—(OCH$_2$CH$_2$)$_u$—OH (9)

$R^{11}$—(OCH$_2$CH$_2$)$_v$—OH (10)

In the above general formulae (9) and (10), $R^{10}$ and $R^{11}$ each independently represent a straight or branched alkyl group having 1 to 20 carbon atoms, and u and v each independently represent an integer of 1 to 50.

$R^{10}$ and $R^{11}$ are preferably a straight or branched alkyl group having 1 to 14 carbon atoms, and specifically, a methyl group, an ethyl group, and a propyl group are preferred. u and v are preferably an integer of 3 to 30.

Specific examples of the anionic surfactant represented by the general formulae (9) and (10) include SOFTANOL 30, SOFTANOL 50, SOFTANOL 70, and SOFTANOL 90 (all manufactured by Nippon Shokubai Co., Ltd.). Among these, SOFTANOL 30, SOFTANOL 50, and SOFTANOL 70 are preferred.

Amount of Surfactant Added

The amount of such surfactants which may be added is preferably no less than 100 ppm by mass and no greater than 10,000 ppm by mass, and more preferably no less than 500 ppm by mass and no greater than 5,000 ppm by mass based on the total amount of the composition for forming an anti-reflection film. The coating properties of the composition for forming an anti-reflection film can be improved by adding the nonionic surfactant and the anionic surfactant in an amount within the above range.

Solvent

Although the composition for forming an anti-reflection film of the present invention is usually used in the form of an aqueous solution, an alcoholic organic solvent may be added as needed since the solubility of the aforementioned fluorochemical surfactant is enhanced by including the alcoholic organic solvent such as isopropyl alcohol or trifluoroalcohol, whereby the uniformity of the coated film can be improved. It is preferred that the amount of the alcoholic organic solvent added to the composition for forming an anti-reflection film be selected within the range of no greater than 15% by mass of the total mass of the solvent added to the composition.

Method for Forming Resist Pattern

The method for forming a resist pattern of the present invention is a method which includes: forming a resist film on a substrate; forming an anti-reflection film on the resist film using the composition for forming an anti-reflection film of the present invention; selectively irradiating the resist film, through the anti-reflection film, with light, resulting in an irradiated resist film, and carrying out heat treatment as needed; and removing the anti-reflection film to obtain the resist pattern before subjecting the irradiated resist film to a developing process or during the development process.

Resist Composition

The resist composition which can be used in the method for forming a resist pattern of the present invention is not particularly limited, and can be freely selected from commonly used compositions. Moreover, any of positive and negative resist compositions can be used, and one which includes a photosensitive material and a film forming material, and is easily developed with an aqueous alkaline solution may be suitably used, in particular.

Particularly preferable resist compositions are positive and negative resist compositions having a variety of required characteristics which can be adapted satisfactorily for ultrafine processing. Exemplary positive resist compositions may include compositions which contain a quinonediazide photosensitive material and a film forming material. Alternatively, chemically amplified resist compositions may be also exemplified which exhibit increased alkaline solubility due to the catalytic action of the acid generated upon exposure.

The negative resist composition is not particularly limited, and any conventionally known negative resist compositions can be used. The chemically amplified negative resist compositions which have been used as a negative resist composition for fine pattern formation, and including three components, i.e., a crosslinking agent, an acid generator, and a base polymer, can be particularly preferably used.

Formation of Resist Film and Anti-Reflection Film

Upon formation of the resist film and the anti-reflection film, the resist composition is first applied on a substrate such as Si, Cu or Au by a spinner process, and the solvent is then volatilized by carrying out a heat treatment. Next, the composition for forming an anti-reflection film of the present invention is applied on the resist film by a spinner process, followed by heat treatment to form an anti-reflection film on the resist film. The heat treatment in forming the anti-reflection film is not necessarily a prerequisite, and the heating may not be carried out when only the application yields a favorable coating film that is superior in uniformity.

Exposure, Development and the Like

After the anti-reflection film is formed, the resist film is selectively irradiated, through the anti-reflection film, with an actinic ray such as ultraviolet ray and far-ultraviolet ray (including excimer laser). Thereafter, heat treatment is carried out if necessary, and a developing process is then carried out to form a resist pattern on the substrate.

The anti-reflection film has an optimal film thickness for efficiently reducing the interference effect of the actinic rays, and this optimal film thickness corresponds to the odd multiple of $\lambda/4n$ (wherein, $\lambda$ represents the wavelength of the actinic ray employed; and n represents the refractive index of the anti-reflection film). For example, in the case of an anti-reflection film having a refractive index of 1.41, the optimal thickness for each of the actinic rays will be: the odd multiple of 77 nm for ultraviolet rays (g-rays); the odd multiple of 65 nm for ultraviolet rays (i-rays); and the odd multiple of 44 nm for far-ultraviolet rays (excimer laser), and the thickness of the anti-reflection film preferably falls within the range of each optimal film thickness ±5 nm.

Moreover, formation of this anti-reflection film on a chemically amplified negative or positive resist film is preferred since the effect of improving resist pattern configuration is achieved in addition to the anti-reflective effect. In general, the chemically amplified resists are accompanied by deficiency in acid on the resist film surface resulting from the action of organic alkaline vapor such as N-methyl-2-pyrrolidone, ammonia, pyridine or triethylamine present in the ambient air around the manufacture line of semiconductors. Therefore, when a negative resist is employed, the upper extremity of the resist pattern is likely to be rounded, while the resist patterns may be linked to form an eave-like shape when a positive resist is used. The effect of improving resist pattern configuration is to prevent such events, and enabling formation of a rectangular resist pattern configuration. As in the foregoing, the anti-reflection film can be suitably used also as a protective film material of the chemically amplified resist films. In addition, the anti-reflection film leads to favorable film stability, similarly to the case in which $C_8F_{17}SO_3H$ (PFOS) is used as a fluorochemical surfactant The anti-reflection film may be removed concurrently with the development process of the resist film, but to subject the anti-reflection film to a peeling process prior to the development process is preferred in order to remove it completely. This peeling process can be carried out by completely removing only the anti-reflection film by applying a solvent that dissolves to remove the anti-reflection film while rotating the silicon wafer by a spinner, for example. As the solvent for removing the anti-reflection film, an aqueous solution including a surfactant can be used.

EXAMPLES

Hereinafter, the present invention will be explained in detail by way of Examples. It should be noted that the present invention is not in anyway limited to the following Examples.

Example 1

A composition for forming an anti-reflection film was obtained by adding to a 5% aqueous isopropyl alcohol solution, 0.84 parts by mass of polyhydroxyethyl acrylate as a water soluble film forming component, 1.68 parts by mass of "EF-N441" (1,1,2,2,3,3,4,4,4-nonafluoro-[(1,1,2,2,3,3,4,4, 4-nonafluorobutyl)sulfonyl]-1-butanesulfoneamide, manufactured by Mitsubishi Materials Corporation) as a fluorochemical surfactant, 0.26 parts by mass of 3-amino-1,2-propanediol as a nitrogen-containing compound and 0.05 parts by mass of "SOFTANOL 30" (manufactured by Nippon Shokubai Co., Ltd.) as a nonionic surfactant.

Example 2

A composition for forming an anti-reflection film was obtained by adding to a 5% aqueous isopropyl alcohol solution, 0.84 parts by mass of polyhydroxyethyl acrylate as a water soluble film forming component, 1.68 parts by mass of "EF-N331" (1,1,2,2,3,3,3-heptafluoropropyl-N-[(1,1,2,2,3, 3,3-heptafluoropropyl)sulfonyl]-1-propanesulfoneamide, manufactured by Mitsubishi Materials Corporation) as a fluorochemical surfactant, 0.26 parts by mass of 3-amino-1,2-propanediol as a nitrogen-containing compound and 0.05 parts by mass of "SOFTANOL 30" (manufactured by Nippon Shokubai Co., Ltd.) as a nonionic surfactant.

Example 3

A composition for forming an anti-reflection film was obtained by adding to a 5% aqueous isopropyl alcohol solution, 0.84 parts by mass of polyhydroxyethyl acrylate as a water soluble film forming component, 1.68 parts by mass of "EF-N441" (1,1,2,2,3,3,4,4,4-nonafluoro-[(1,1,2,2,3,3,4,4, 4-nonafluorobutyl)sulfonyl]-1-butanesulfoneamide, manufactured by Mitsubishi Materials Corporation) as a fluorochemical surfactant, 0.26 parts by mass of 2-amino-1,3-propanediol as a nitrogen-containing compound and 0.05 parts by mass of "SOFTANOL 30" (manufactured by Nippon Shokubai Co., Ltd.) as a nonionic surfactant.

Example 4

A composition for forming an anti-reflection film was obtained by adding to pure water, 0.84 parts by mass of polyhydroxyethyl acrylate as a water soluble film forming component, 1.68 parts by mass of "EF-N441" (1,1,2,2,3,3,4, 4,4-nonafluoro-[(1,1,2,2,3,3,4,4,4-nonafluorobutyl)sulfonyl]-1-butanesulfoneamide, manufactured by Mitsubishi Materials Corporation) as a fluorochemical surfactant, 0.26 parts by mass of 3-amino-1,2-propanediol as a nitrogen-containing compound and 0.05 parts by mass of "SOFTANOL 30" (manufactured by Nippon Shokubai Co., Ltd.) as a nonionic surfactant.

Example 5

A composition for forming an anti-reflection film was obtained by adding to a 5% aqueous isopropyl alcohol solution, 0.84 parts by mass of "GANTREZ" (AN-139 (trade name), manufactured by ISP) as a water soluble film forming component, 1.68 parts by mass of "EF-N441" (1,1,2,2,3,3,4, 4,4-nonafluoro-[(1,1,2,2,3,3,4,4,4-nonafluorobutyl)sulfonyl]-1-butanesulfoneamide, manufactured by Mitsubishi Materials Corporation) as a fluorochemical surfactant, 0.26 parts by mass of 3-amino-1,2-propanediol as a nitrogen-containing compound and 0.05 parts by mass of "SOFTANOL 30" (manufactured by Nippon Shokubai Co., Ltd.) as a nonionic surfactant.

Example 6

A composition for forming an anti-reflection film was obtained by adding to a 5% aqueous isopropyl alcohol solution, 0.84 parts by mass of "GANTREZ" (AN-139 (trade name), manufactured by ISP) as a water soluble film forming component, 1.68 parts by mass of "EF-N331" (1,1,2,2,3,3,3-heptafluoropropyl-N-[(1,1,2,2,3,3,3-heptafluoropropyl)sulfonyl]-1-propanesulfoneamide, manufactured by Mitsubishi Materials Corporation) as a fluorochemical surfactant, 0.26 parts by mass of 3-amino-1,2-propanediol as a nitrogen-containing compound and 0.05 parts by mass of "SOFTANOL 30" (manufactured by Nippon Shokubai Co., Ltd.) as a nonionic surfactant.

Example 7

A composition for forming an anti-reflection film was obtained by adding to a 5% aqueous isopropyl alcohol solution, 0.84 parts by mass of "GANTREZ" (AN-139 (trade name), manufactured by ISP) as a water soluble film forming component, 1.68 parts by mass of "EF-N441" (1,1,2,2,3,3,4, 4,4-nonafluoro-[(1,1,2,2,3,3,4,4,4-nonafluorobutyl)sulfonyl]-1-butanesulfoneamide, manufactured by Mitsubishi Materials Corporation) as a fluorochemical surfactant, 0.26 parts by mass of 2-amino-1,3-propanediol as a nitrogen-containing compound and 0.05 parts by mass of "SOFTANOL 30" (manufactured by Nippon Shokubai Co., Ltd.) as a nonionic surfactant.

Example 8

A composition for forming an anti-reflection film was obtained by adding to pure water, 0.84 parts by mass of "GANTREZ" (AN-139 (trade name), manufactured by ISP) as a water soluble film forming component, 1.68 parts by mass of "EF-N441" (1,1,2,2,3,3,4,4,4-nonafluoro-[(1,1,2,2, 3,3,4,4,4-nonafluorobutyl)sulfonyl]-1-butanesulfoneamide, manufactured by Mitsubishi Materials Corporation) as a fluorochemical surfactant, 0.26 parts by mass of 3-amino-1,2-propanediol as a nitrogen-containing compound and 0.05 parts by mass of "SOFTANOL 30" (manufactured by Nippon Shokubai Co., Ltd.) as a nonionic surfactant.

Comparative Example 1

A composition for forming an anti-reflection film was obtained in a similar manner to Example 1 except that 0.84 parts by mass of polyvinylpyrrolidone was used as the water soluble film forming component.

Comparative Example 2

A composition for forming an anti-reflection film was obtained in a similar manner to Example 3 except that 1.68 parts by mass of "EF-101" (PFOS, manufactured by Mitsubishi Materials Corporation) was used as the fluorochemical surfactant.

Evaluation of Number of Surface Defects

The composition for forming an anti-reflection film obtained in any one of Examples 1 to 8, or Comparative Example 1 or 2 was coated on an 8-inch silicon wafer using a spinner "DNS3" (manufactured by DAINIPPON SCREEN MFG. CO., LTD.), and subjected to a heat treatment of 60° C. for 60 sec. The anti-reflection film had a film thickness of 44 nm. With respect to the layered products, the number of defects in the wafer was measured at a pixel size of 1.25 µm using a surface defect inspection system "KLA-2132" (manufactured by KLA TENCOR Corporation). The results are shown in Table 1.

TABLE 1

| | Number of surface defects |
|---|---|
| Example 1 | 2 |
| Example 2 | 3 |
| Example 3 | 2 |
| Example 4 | 2 |
| Example 5 | 2 |
| Example 6 | 3 |
| Example 7 | 2 |
| Example 8 | 2 |
| Comparative Example 1 | 52 |
| Comparative Example 2 | 48 |

From Table 1, it is proven that the number of surface defects is less on the anti-reflection films of Examples 1 and 5 than on the anti-reflection film of Comparative Example 1. These results reveal that the anti-reflection film formed with the composition for forming an anti-reflection film of the present invention is accompanied by less generation of deposits that have an adverse effect on patterning of resist films.

Evaluation of Optical Characteristics

"TDUR-P3435 (trade name)" (manufactured by Tokyo Ohka Kogyo Co., Ltd.) was coated as a positive resist composition on an 8-inch silicon wafer using a spinner, followed by subjecting to a heat treatment of 90° C. for 60 sec to obtain a resist film having a film thickness of 310 nm. The composition for forming an anti-reflection film obtained in any one of Examples 1 to 8, or Comparative Example 1 or 2 was coated on thus obtained resist film using a spinner, and subjected to a heat treatment of 60° C. for 60 sec. The anti-reflection film had a film thickness of 44 nm.

Using a spectroellipsometer "Wvase32 (product name)" (manufactured by J. A. WOOLLAMJAPAN Corp.), the refractive index (n value) and extinction coefficient (k value) at 193 nm, 248 nm, and 365 nm of the aforementioned layered products were measured. The results are shown in Table 2.

TABLE 2

| | n value | | | k value | | |
|---|---|---|---|---|---|---|
| | 193 nm | 248 nm | 365 nm | 193 nm | 248 nm | 365 nm |
| Example 1 | 1.57 | 1.49 | 1.44 | 0 | 0 | 0 |
| Example 2 | 1.57 | 1.49 | 1.44 | 0 | 0 | 0 |
| Example 3 | 1.57 | 1.49 | 1.44 | 0 | 0 | 0 |
| Example 4 | 1.57 | 1.49 | 1.44 | 0 | 0 | 0 |
| Example 5 | 1.57 | 1.49 | 1.44 | 0 | 0 | 0 |
| Example 6 | 1.57 | 1.49 | 1.44 | 0 | 0 | 0 |
| Example 7 | 1.57 | 1.49 | 1.44 | 0 | 0 | 0 |
| Example 8 | 1.57 | 1.49 | 1.44 | 0 | 0 | 0 |
| Comparative Example 1 | 1.57 | 1.49 | 1.44 | 0 | 0 | 0 |
| Comparative Example 2 | 1.52 | 1.49 | 1.43 | 0 | 0 | 0 |

Table 2 shows that the layered products obtained using the compositions for forming an anti-reflection film of Examples 3 and 7 exhibited similar refractive indices and extinction coefficients as those of the layered product obtained using the composition for forming an anti-reflection film of Comparative Example 2 containing PFOS as a fluorochemical surfactant.

Evaluation of Resist Pattern Configuration

By a similar method to that employed in "Evaluation of Optical Characteristics", a layered product was manufactured using the anti-reflection film obtained in any one of Examples 1 to 8, or Comparative Example 1 or 2.

The aforementioned layered product was irradiated with a KrF excimer laser (248 nm) through a mask pattern using a reduced projection exposure aligner "NSR-S203B" (trade name, manufactured by Nikon Corporation), and subjected to a baking process on a hot plate at 90° C. for 60 sec. Thereafter, the layered product was washed with pure water for 6 sec, and developed using an aqueous solution of NMD-3 (manufactured by Tokyo Ohka Kogyo Co., Ltd.), at 23° C. for 30 sec, followed by washing with pure water for 10 sec to obtain a resist pattern.

Thus formed 180-nm line pattern on the silicon wafer was observed with a scanning electron microscope (SEM), and the pattern configuration of the resist pattern was evaluated. Consequently, the layered products obtained using the compositions for forming the anti-reflection film of Examples 1 to 8 exhibited similar characteristics even as compared with the layered product obtained using the composition for forming an anti-reflection film of Comparative Example 1 or 2.

The invention claimed is:

1. A composition for forming an anti-reflection film to be provided on a resist film,
the composition comprising at least a fluorochemical surfactant, a water soluble film forming component and a nitrogen-containing compound,
wherein the fluorochemical surfactant is at least one selected from the group consisting of compounds represented by the following formulae (1), (2), (3) and (4),

$$C_m F_{2m+1} COOH \tag{1}$$

$$(C_n F_{2n+1} SO_2)_2 NH \tag{2}$$

$$(3)$$

$$(4)$$

wherein, in the above formulae (1), (2), (3) and (4): m represents an integer of 10 to 15; n represents an integer of 1 to 5; o represents 2 or 3; p represents 2 or 3; and $R_f$ represents a hydrogen atom or an alkyl group having 1 to 16 carbon atoms in which a portion or all hydrogen atoms are substituted with a fluorine atom, and the alkyl group may have a hydroxy group, an alkoxyalkyl group, a carboxyl group, or an amino group, the water soluble film forming component comprises a water soluble resin having at least one constituent unit represented by the following formula (5),

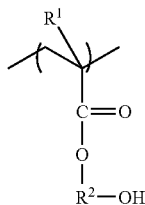
(5)

wherein, in the above formula (5), $R^1$ represents a hydrogen atom or a methyl group, and $R^2$ represents an alkylene chain having 1 to 6 carbon atoms, and the nitrogen-containing compound is at least one selected from the group consisting of 3-amino-1,2-propanediol and 2-amino-1,3-propanediol.

2. The composition for forming an anti-reflection film according to claim 1, wherein the water soluble resin further has a constituent unit derived from at least one selected from the group consisting of acrylic acid and methacrylic acid.

3. The composition for forming an anti-reflection film according to claim 1, wherein the water soluble resin has a mass average molecular weight of 1,000 to 1,000,000.

4. The composition for forming an anti-reflection film according to claim 1, further comprising a nonionic surfactant represented by the following formula (7):

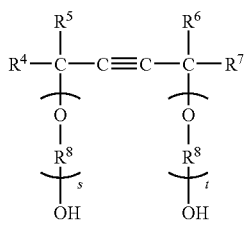
(7)

wherein, in the above formula (7), $R^4$, $R^5$, $R^6$ and $R^7$ each independently represent a straight or branched alkyl group having 1 to 6 carbon atoms, $R^8$ represents a straight or branched alkylene chain having 2 to 4 carbon atoms, and s and t each independently represent an integer of 0 to 30.

5. The composition for forming an anti-reflection film according to claim 1, further comprising an anionic surfactant represented by the following formula (8):

$R^9$—SO$_3$H (8)

wherein, in the above formula (8), $R^9$ represents a straight or branched alkyl group having 7 to 20 carbon atoms, and the alkyl group may have at least one group selected from the group consisting of a hydroxy group and a carboxyl group, and may be interrupted by at least one group selected from the group consisting of a phenylene group and an oxygen atom.

6. The composition for forming an anti-reflection film according to claim 1, further comprising at least one anionic surfactant selected from the group consisting of anionic surfactants represented by the following formulae (9) and (10):

$R^{10}$—CO—(OCH$_2$CH$_2$)$_u$—OH (9)

$R^{11}$—(OCH$_2$CH$_2$)$_v$—OH (10)

wherein, in the above formulae (9) and (10), $R^{10}$ and $R^{11}$ each independently represent a straight or branched alkyl group having 1 to 20 carbon atoms, and u and v each independently represent an integer of 1 to 50.

7. A method for forming a resist pattern, the method comprising:

forming a resist film on a substrate;

forming an anti-reflection film on the resist film using the composition for forming an anti-reflection film according to claim 1;

selectively irradiating the resist film, through the anti-reflection film, with light, resulting in an irradiated resist film, and carrying out heat treatment as needed; and removing the anti-reflection film to obtain the resist pattern before subjecting the irradiated resist film to a developing process or during the developing process.

8. A composition for forming an anti-reflection film to be provided on a resist film, the composition comprising at least a fluorochemical surfactant, a water soluble film forming component and a nitrogen-containing compound, wherein the fluorochemical surfactant is at least one selected from the group consisting of compounds represented by the following formulae (1), (2), (3) and (4),

C$_m$F$_{2m+1}$COOH (1)

(C$_n$F$_{2n+1}$SO$_2$)$_2$NH (2)

(3)

(4)

wherein, in the above formulae (1), (2), (3) and (4): m represents an integer of 10 to 15; n represents an integer of 1 to 5; o represents 2 or 3; p represents 2 or 3; and R$_f$ represents a hydrogen atom or an alkyl group having 1 to 16 carbon atoms in which a portion or all hydrogen atoms are substituted with a fluorine atom, and the alkyl group may have a hydroxy group, an alkoxyalkyl group, a carboxyl group, or an amino group, the water soluble film forming component comprises at least a water soluble resin represented by the following formula (6),

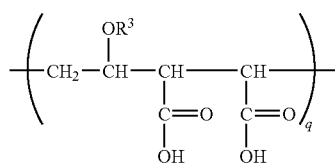

(6)

wherein, in the above formula (6), R³ represents a hydrogen atom or an alkyl group or a hydroxyalkyl group having 1 to 6 carbon atoms, and q represents the number of repeating units, and the nitrogen-containing compound is at least one selected from the group consisting of 3-amino-1,2-propanediol and 2-amino-1,3-propanediol.

9. The composition for forming an anti-reflection film according to claim 8, wherein the water soluble resin has a mass average molecular weight of 1,000 to 1,000,000.

10. The composition for forming an anti-reflection film according to claim 8, further comprising a nonionic surfactant represented by the following formula (7):

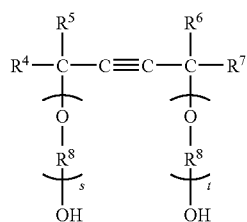

(7)

wherein, in the above formula (7), R⁴, R⁵, R⁶ and R⁷ each independently represent a straight or branched alkyl group having 1 to 6 carbon atoms, R⁸ represents a straight or branched alkylene chain having 2 to 4 carbon atoms, and s and t each independently represent an integer of 0 to 30.

11. The composition for forming an anti-reflection film according to claim 8, further comprising an anionic surfactant represented by the following formula (8):

$$R^9\text{—}SO_3H \tag{8}$$

wherein, in the above general (8), R⁹ represents a straight or branched alkyl group having 7 to 20 carbon atoms, and the alkyl group may have at least one group selected from the group consisting of a hydroxy group and a carboxyl group, and may be interrupted by at least one group selected from the group consisting of a phenylene group and an oxygen atom.

12. The composition for forming an anti-reflection film according to claim 8, further comprising at least one anionic surfactant selected from the group consisting of anionic surfactants represented by the following formulae (9) and (10):

$$R^{10}\text{—}CO\text{—}(OCH_2CH_2)_u\text{—}OH \tag{9}$$

$$R^{11}\text{—}(OCH_2CH_2)_v\text{—}OH \tag{10}$$

wherein, in the above formulae (9) and (10), R¹⁰ and R¹¹ each independently represent a straight or branched alkyl group having 1 to 20 carbon atoms, and u and v each independently represent an integer of 1 to 50.

13. A method for forming a resist pattern, the method comprising:

forming a resist film on a substrate;

forming an anti-reflection film on the resist film using the composition for forming an anti-reflection film according to claim 8;

selectively irradiating the resist film, through the anti-reflection film, with light, resulting in an irradiated resist film, and carrying out heat treatment as needed; and removing the anti-reflection film to obtain the resist pattern before subjecting the irradiated resist film to a developing process or during the developing process.

* * * * *